(12) United States Patent
Loy et al.

(10) Patent No.: US 11,793,004 B2
(45) Date of Patent: Oct. 17, 2023

(54) RESISTIVE RANDOM ACCESS MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 219 days.

(21) Appl. No.: 16/994,647

(22) Filed: Aug. 16, 2020

(65) Prior Publication Data

US 2022/0052114 A1 Feb. 17, 2022

(51) Int. Cl.
*H01L 29/41* (2006.01)
*H10B 63/00* (2023.01)
*G11C 7/18* (2006.01)
*H10N 70/00* (2023.01)

(52) U.S. Cl.
CPC ............... *H10B 63/34* (2023.02); *G11C 7/18* (2013.01); *H10N 70/8265* (2023.02); *H10N 70/841* (2023.02); *H10N 70/8836* (2023.02)

(58) Field of Classification Search
CPC ............... H01L 27/2454; H01L 45/124; H01L 45/1253; H01L 45/147; H01L 45/1683; H01L 27/2472; H01L 45/08; H01L 45/1226; H01L 45/145; H01L 45/146; H01L 27/2463; H01L 45/12; H01L 45/16; G11C 7/18; H10B 63/34; H10B 63/80; H10B 63/82; H10N 70/8265; H10N 70/841; H10N 70/8836; H10N 70/066; H10N 70/24; H10N 70/823; H10N 70/883; H10N 70/8833; H10N 70/011; H10N 70/801

See application file for complete search history.

(56) References Cited

U.S. PATENT DOCUMENTS

| | | | |
|---|---|---|---|
| 9,564,587 B1 * | 2/2017 | Jo | H01L 27/249 |
| 2011/0220861 A1 * | 9/2011 | Himeno | H01L 27/101 |
| | | | 257/E47.001 |
| 2013/0168634 A1 * | 7/2013 | Lee | H01L 45/146 |
| | | | 257/4 |

(Continued)

OTHER PUBLICATIONS

L. Goux et al., Asymmetry and Switching Phenomenology in TiN\Al2O3\HfO2\Hf Systems, ECS Solid State Letters, 2012, pp. 63-65, vol. 1, Issue 4, The Electrochemical Society.

(Continued)

*Primary Examiner* — Samuel Park
(74) *Attorney, Agent, or Firm* — David Cain

(57) ABSTRACT

The present disclosure generally relates to memory devices and methods of forming the same. More particularly, the present disclosure relates to resistive random-access (Re-RAM) memory devices. The present disclosure provides a memory device including a first electrode, a dielectric cap above the first electrode, a second electrode laterally adjacent to the first electrode, in which an upper surface of the second electrode is substantially coplanar with an upper surface of the dielectric cap, and a resistive layer between the first electrode and the second electrode. An edge of the first electrode is electrically coupled to an edge of the second electrode by at least the resistive layer.

15 Claims, 12 Drawing Sheets

(56) References Cited

U.S. PATENT DOCUMENTS

2017/0346005 A1* 11/2017 Goux .................. H01L 45/08
2018/0175291 A1*  6/2018 Chu ................... H01L 45/08
2019/0088874 A1*  3/2019 Shum ................. H01L 45/085
2019/0305218 A1* 10/2019 Trinh ................. H01L 45/16
2020/0357851 A1* 11/2020 Sung .................. H01L 27/24

OTHER PUBLICATIONS

Chen et al., Characterization of SiOx/HfOx Bilayer Resistive-Switching Memory Devices, ECS Transactions, 2016, pp. 25-33, vol. 72, Issue 2, The Electrochemical Society.

Chuang et al., Effects of Electric Fields on the Switching Properties Improvements of RRAM Device With a Field-Enhanced Elevated-Film-Stack Structure, Journal of the Electron Devices Society, 2018, pp. 622-626, vol. 6, IEEE.

Calka et al., Engineering of the Chemical Reactivity of the Ti/HfO2 Interface for RRAM: Experiment and Theory, ACS Applied Materials Interfaces, 2014, pp. 5056-5060, vol. 6, American Chemical Society.

Walcyzk et al., On the role of Ti adlayers for resistive switching in HfO2-based metal-insulator-metal structures: Top versus bottom electrode integration, Journal of Vacuum Science & Technology B, 2011, pp. 01AD02-1-01AD02-7, vol. 29, Issue 1, American Vacuum Society.

Zhong et al., The effect of a Ta oxygen scavenger layer on HfO2-based resistive switching behavior: thermodynamic stability, electronic structure, and low-bias transport, Physical Chemistry Chemical Physics, 2016, pp. 1-9, Issue 10, The Royal Society of Chemistry.

\* cited by examiner

RESISTIVE RANDOM ACCESS MEMORY DEVICES

FIELD OF THE INVENTION

The disclosed subject matter relates generally to memory devices and methods of forming the same. More particularly, the present disclosure relates to resistive random-access (ReRAM) memory devices.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to its ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high-resistive state (HRS), which may be representative of an off or 0 state; and a low-resistive state (LRS), which may be representative of an on or 1 state. However, these devices may experience large variations in resistive switching characteristics and may cause large fluctuations of current flow within the device, which decreases the performance of the device and increases its power consumption.

Therefore, there is a need to provide improved memory devices that can overcome, or at least ameliorate, one or more of the disadvantages as described above.

SUMMARY

In an aspect of the present disclosure, there is provided a memory device including a first electrode, a dielectric cap above the first electrode, a second electrode laterally adjacent to the first electrode, in which an upper surface of the second electrode is substantially coplanar with an upper surface of the dielectric cap, and a resistive layer between the first electrode and the second electrode. An edge of the first electrode is electrically coupled to an edge of the second electrode by at least the resistive layer.

In another aspect of the present disclosure, there is provided a memory device including a first electrode, a dielectric cap above the first electrode, a second electrode laterally adjacent to the first electrode, in which an upper surface of the second electrode is substantially coplanar with an upper surface of the dielectric cap, a resistive layer between the first electrode and the second electrode, and an oxygen scavenging layer between the first electrode and the second electrode. The oxygen scavenging layer is disposed on the resistive layer and includes a material that is different from the resistive layer. An edge of the first electrode is electrically coupled to an edge of the second electrode by the resistive layer and the oxygen scavenging layer.

In yet another aspect of the present disclosure, there is provided a method of forming a memory device by forming a first electrode and a dielectric cap in a dielectric region, wherein the dielectric cap is formed upon the first electrode, forming a resistive layer in an opening defined in the dielectric region, and forming a second electrode in the dielectric region, the second electrode being formed laterally adjacent to the first electrode and the dielectric cap, in which the resistive layer is between the first electrode and the second electrode, and an upper surface of the second electrode is substantially coplanar with an upper surface of the dielectric cap.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
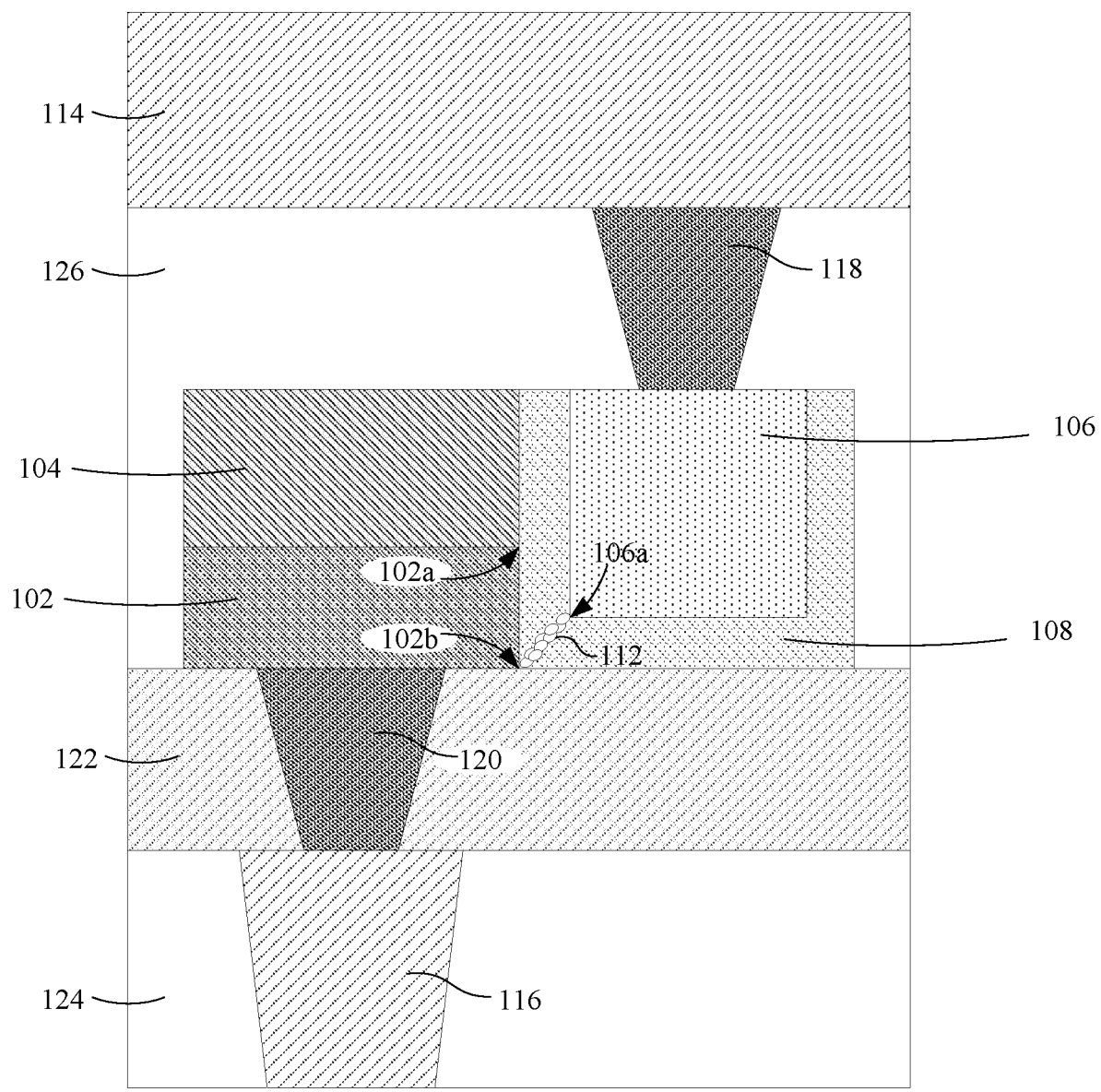
FIG. 1A through FIG. 1G are cross-sectional views of a memory device, in accordance with embodiments of the present disclosure.

FIG. 1A illustrates a cross-sectional view of an exemplary memory device in accordance with the present disclosure. The device includes a first electrode 102, a dielectric cap 104 above the first electrode 102, and a second electrode 106 that is laterally adjacent to the first electrode 102, in which an upper surface of the second electrode 106 is substantially coplanar with an upper surface of the dielectric cap 104.

The first electrode 102 and the second electrode 106 may be connected to various interconnect structures 114, 116, 118, 120 to send or receive electrical signals between other circuitry and/or active components in a memory device. The interconnect structures may include interconnect vias 118, 120 and conductive lines 114, 116, and may include a metal such as copper, cobalt, aluminum, or an alloy thereof. The conductive lines 114, 116 may be configured as source lines or word lines, depending on the design requirements of the memory device. As used herein, the terms "source line(s)" and "bit line(s)" may refer to electrical terminal connections that link cells in a memory device circuitry.

Example of the active components (not shown) that may be connected to the first electrode 102 and the second electrode 106 may include diodes (e.g., single-photon avalanche diode) or transistors such as, but not limited to, planar field-effect transistor, fin-shaped field-effect transistors (Fin-FETs), ferroelectric field-effect transistors (FeFETs), complementary metal-oxide semiconductor (CMOS) transistors, and bi-polar junction transistors (BJT).

A resistive layer 108 is positioned between the first electrode 102 and the second electrode 106. The resistive layer 108 may conform to sidewalls and a lower surface of the second electrode 106. An edge of the first electrode 102 is electrically coupled to an edge of the second electrode 106 by the resistive layer 108. In particular, the resistive layer 108 may include a conductive path 112 configured to form between the edge of the first electrode 102 to the edge of the second electrode 106 in response to an electric signal (e.g., a set voltage or current).

For example, a set voltage may be applied to one of the conductive lines 114, 116 to provide a potential difference between the first electrode 102 and the second electrode 106. This potential difference may cause the formation of the conductive path 112 to allow electrical conduction between the first electrode 102 and the second electrode 106. In particular, the conductive path 112 may be a filament that is formed by diffusion or drift of electrical charges (e.g., ions, electrons) induced by the potential difference.

The resistive layer 108 may also be configured to have a switchable resistance in response to a change in the electric signal. For example, the formation of the filament may reduce the resistance of the resistive layer 108 when the electric signal is applied. Upon a reversed flow of the electric signal, the filament may be removed and the resistance of the resistive layer 108 may be increased, thereby enabling a controllable resistive nature of the resistive layer 108. The resistive layer 108 may exhibit resistive changing properties characterized by different resistive states of the material forming this layer. These resistive states (e.g., a high resistive state or a low resistive state) may be used to represent one or more bits of information. During operational switching used to change the stored data, the resistive layer 108 may change its resistive state when a switching electric signal (e.g., a set voltage or a reset voltage) is applied to the resistive layer 108.

As shown, the first electrode 102 may have a corner edge 102a at its upper surface and a corner edge 102b at its lower surface. The second electrode 106 may have a corner edge 106a at its lower surface. When an electric signal is applied, the corner edges 102a, 102b of the first electrode and the corner edge 106a of the second electrode 106 may have the strongest electric fields (i.e., the largest concentration of electric charges). Thus, the corner edges 102a, 102b of the first electrode 102 may be positioned proximal to the corner edge 106a of the second electrode 106 so that the formed conductive path 112 may be confined in a region between one of the corner edges 102a, 102b of the first electrode 102 and the corner edge 106a of the second electrode 106 when the electric signal is applied. The confinement of the conducting path 112 may help to reduce the stochasticity of its formation, which in turn reduces the cycle-to-cycle and device-to-device variability of the memory devices in the high resistive state. In other words, the variability of the resistance of the resistive layer 108 in the high resistive state may be reduced. This may enable a stable switching of the resistive states in the resistive layer 108 during operation of the device and may reduce its overall power consumption.

In the embodiment shown in FIG. 1A, the lower surface of the second electrode 106 may be positioned between an upper surface of the first electrode 102 and a lower surface of the first electrode 102 such that the corner edge 106a at the lower surface of the second electrode 106 is proximal to either the corner edge 102a at the upper surface of the first electrode 102 or the corner edge 102b at the lower surface of the first electrode 102. In another embodiment (not shown), the lower surface of the second electrode 106 may be positioned above or substantially coplanar with the upper surface of the first electrode 102 such that the corner edge 106a at the lower surface of the second electrode is proximal to the corner edge 102a at the upper surface of the first electrode 102.

While FIG. 1A illustrates the conductive path 112 connecting the corner edge 106a at the lower surface of the second electrode 106 with the corner edge 102b at the lower surface of the first electrode 102, it should be understood that the conductive path 112 may also connect the corner edge 106a at the lower surface of the second electrode 106 with the corner edge 102a at the upper surface of the first electrode 102, depending on the proximity of the corner edges 102a, 102b, 106a.

The resistive layer 108 may have a thickness that is configured so that a relatively low voltage level may be sufficient to switch the resistance of the resistive layer 108. In some embodiments, the resistive layer 108 may have a thickness in the range of about 1 nm to about 10 nm. Examples of the material for the resistive layer 108 may include, but not limited to, carbon polymers, perovskites, silicon dioxide, metal oxides, or nitrides. Some examples of metal oxides may include lanthanide oxides, tungsten oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. In some embodiments, metal oxides with a bandgap greater than 3 eV may be used. Examples of such oxides may include titanium oxide, tungsten oxide, niobium oxide, nickel oxide, zinc oxide, lanthanide oxides, hafnium oxide, aluminum oxide, tantalum oxide, zirconium oxide, and yttrium oxide.

The dielectric cap 104 may provide structural protection for the first electrode 102 and may include non-metals, such as, but not limited to, oxides or nitrides. For example, the dielectric cap 104 may include silicon dioxide, silicon nitride, titanium oxide, or combinations thereof. The dielectric cap 104 may be disposed upon the upper surface of the first electrode 102 and may define the thickness of the second electrode 106 by having the upper surface of the second electrode 106 to be substantially coplanar with the upper surface of the dielectric cap 104. Advantageously, by positioning the dielectric cap 104 on the upper surface of the first electrode 102, the dielectric cap 104 may prevent the formation of any conductive path (or filament) that links edges at the upper surface of the first electrode 102 with edges at the upper surface of the second electrode 106. Hence, the filament may be confined to a preferred region between one of the corner edges 102a, 102b of the first electrode 102 and the corner edge 106a of the second electrode 106. In an embodiment, the second electrode 106 may be structured to have a larger thickness as compared to the first electrode 102.

In an embodiment, the first electrode 102 may be structured as an active electrode while the second electrode 106 may be structured as an inert electrode. Alternatively, in another embodiment, the second electrode may be structured as the active electrode while the first electrode 106 may be structured as the inert electrode.

As used herein, the term "active electrode" may refer to an electrode having a conductive material that is capable of being oxidized and/or reduced (i.e., redox reactions) to generate electric charges for the formation of the conductive path 112 in the resistive layer 108. Examples of the conductive material in the active electrode may include, but not limited to, tantalum (Ta), hafnium (Hf), titanium (Ti), copper (Cu), silver (Ag), cobalt (Co), tungsten (W), or an alloy thereof. Conversely, the term "inert electrode" may refer to a conductive material that is capable of resisting redox reactions. Examples of the conductive material for the inert electrode may include, but not limited to, ruthenium (Ru), platinum (Pt), titanium nitride (TiN), tantalum nitride (TaN). Preferably, the active electrode may be structured to have a larger thickness as compared to the inert electrode. A larger thickness for the active electrode may provide sufficient material for the redox reaction between the active electrode and the resistive layer.

In the embodiment shown in FIG. 1A, the conductive line 116 may be formed in a first dielectric region 124. The dielectric cap 104, the first electrode 102, the second electrode 106, the resistive layer 108 may be formed in a second dielectric region 126. The first dielectric region 124 and the second dielectric region 126 may be an inter-metal dielectric (IMD) layer or part of a "metallization level". Examples of dielectric material in the first dielectric region 124 and the second dielectric region 126 may include, but not limited to, silicon dioxide, tetraethyl orthosilicate (TEOS), or a material having a chemical composition of $SiC_xO_yH_z$, wherein x, y, and z are in stoichiometric ratio.

A dielectric layer 122 may be disposed between the first dielectric region 124 and the second dielectric region 126. The interconnect via 120 may be formed in the dielectric layer 122. Examples of dielectric material in the dielectric layer 122 may include, but not limited to, silicon nitride (SiN), or Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75.

Figure 1B:
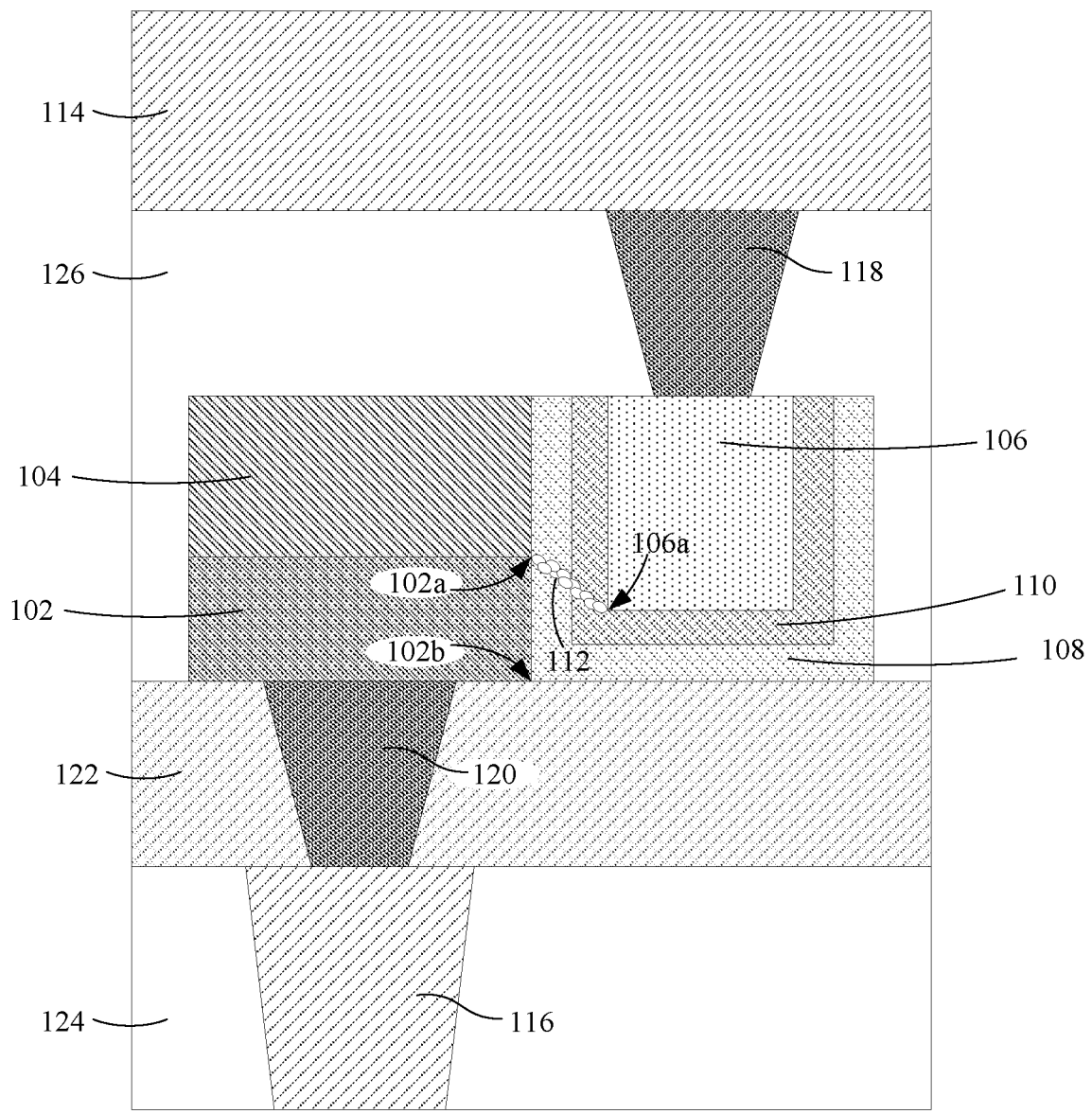

Referring to FIG. 1B, in which like reference numerals refer to like features in FIG. 1A, another embodiment of a memory device is shown. The memory device may include an oxygen scavenging layer 110 between the first electrode 102 and the second electrode 106. An edge of the first electrode 102 may be electrically coupled to an edge of the second electrode 106 by the resistive layer 108 and the oxygen scavenging layer 110. For example, a conductive path 112 may be configured to form in the resistive layer 108 and the oxygen scavenging layer 110 so as to electrically couple the edge of the first electrode 102 to the edge of the second electrode 106 in response to an electric signal (e.g., a set voltage or current).

As used herein, the terms "oxygen scavenging" or "oxygen scavenger" may refer to a composition, layer, film, or material that can consume, deplete, or react with oxygen ions from a given environment. As shown, the oxygen scavenging layer 110 is disposed on the resistive layer 108 and may conform to the sidewalls and the lower surface of the second electrode 106. The oxygen scavenging layer 110 may include a material that is different from the resistive layer 108. In some embodiments, the oxygen scavenging layer 110 may include tantalum (Ta), titanium (Ti), tungsten (W), hafnium oxide ($HfO_2$), or aluminum oxide ($Al_2O_3$). The oxygen scavenging layer 110 may be arranged to contact the active electrode.

In the embodiment shown in FIG. 1B, the second electrode 106 is structured as the active electrode while the first electrode 102 is structured as the inert electrode. The active electrode (e.g., second electrode 106) is disposed on the oxygen scavenging layer 110, the oxygen scavenging layer 110 is disposed on the resistive layer 108 and a sidewall of the inert electrode (e.g., first electrode 102) contacts the resistive layer 108.

The oxygen scavenging layer 110 may be configured to induce a movement of ions from the resistive layer 108 towards the oxygen scavenging layer 110 in response to the electric signal. For example, the oxygen scavenging layer 110 may scavenge oxygen ions from the resistive layer 108 to increase the concentration or density of oxygen vacancies in the resistive layer 108 when a potential difference is applied across the active electrode (e.g., the second electrode 106) and the inert electrode (e.g., the first electrode 102). The oxygen ions scavenged by the oxygen scavenging layer 110 may subsequently drift to the active electrode to complete the conductive path 112 between the first electrode 102 and the second electrode 106.

Advantageously, the presence of the oxygen scavenging layer 110 is found to provide additional confinement of the filament in the region between the corner edges 102a, 102b of the first electrode 102 and the corner edge 106a of the second electrode 106, thereby achieving a further reduction of variability of the resistance of the resistive layer 108.

Figure 1C:
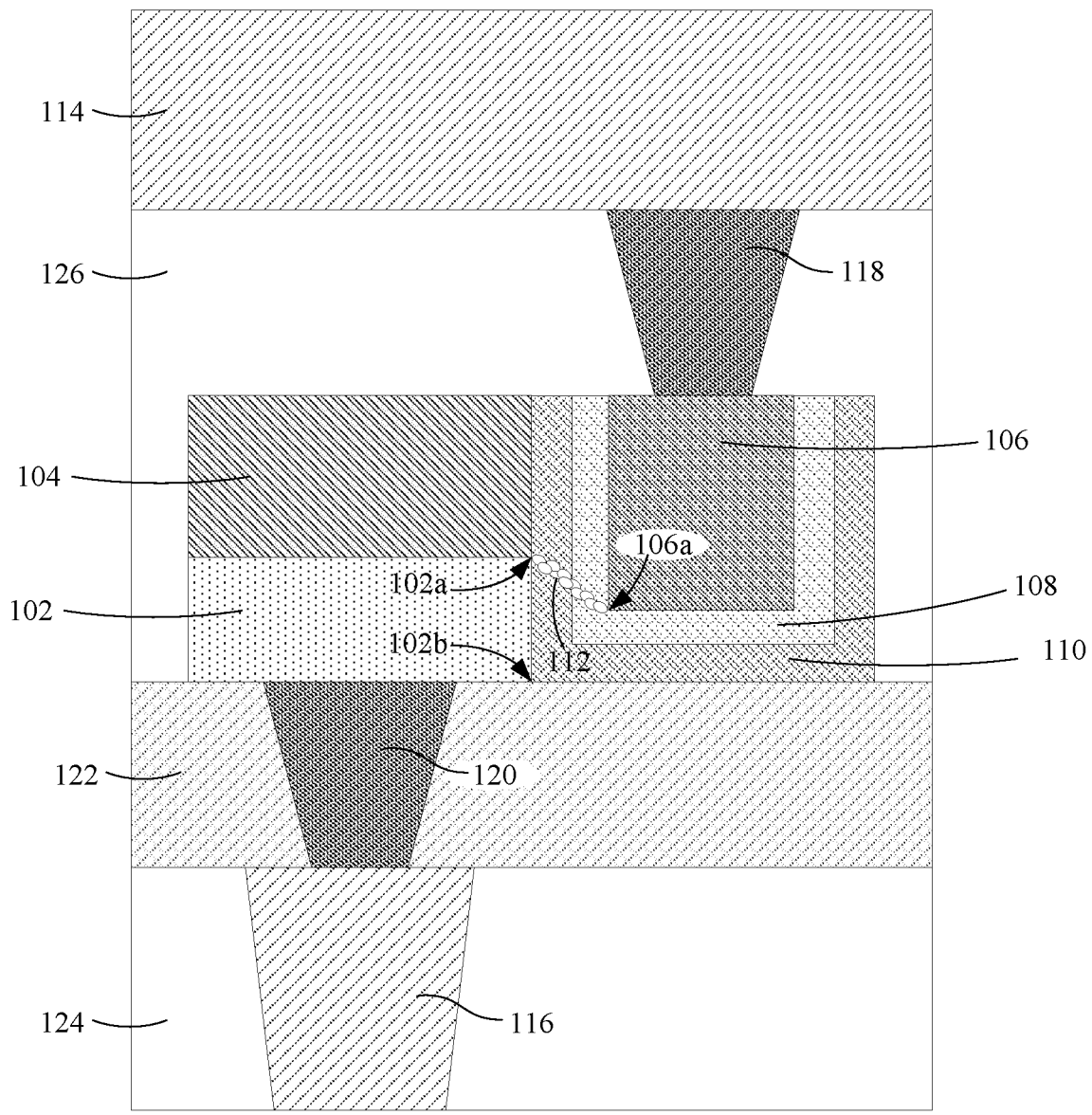

Referring to FIG. 1C, in which like reference numerals refer to like features in FIG. 1B, another embodiment of a memory device is shown. As described herein, the oxygen scavenging layer 110 may be arranged to contact the active electrode. In the embodiment shown in FIG. 1C, the first electrode 102 is structured as the active electrode while the second electrode 106 is structured as the inert electrode. The inert electrode (e.g., second electrode 106) is disposed on the resistive layer 108, the resistive layer 108 is disposed on the oxygen scavenging layer 110, and a sidewall of the active electrode (e.g., first electrode 102) contacts the oxygen scavenging layer 110.

Figure 1D:
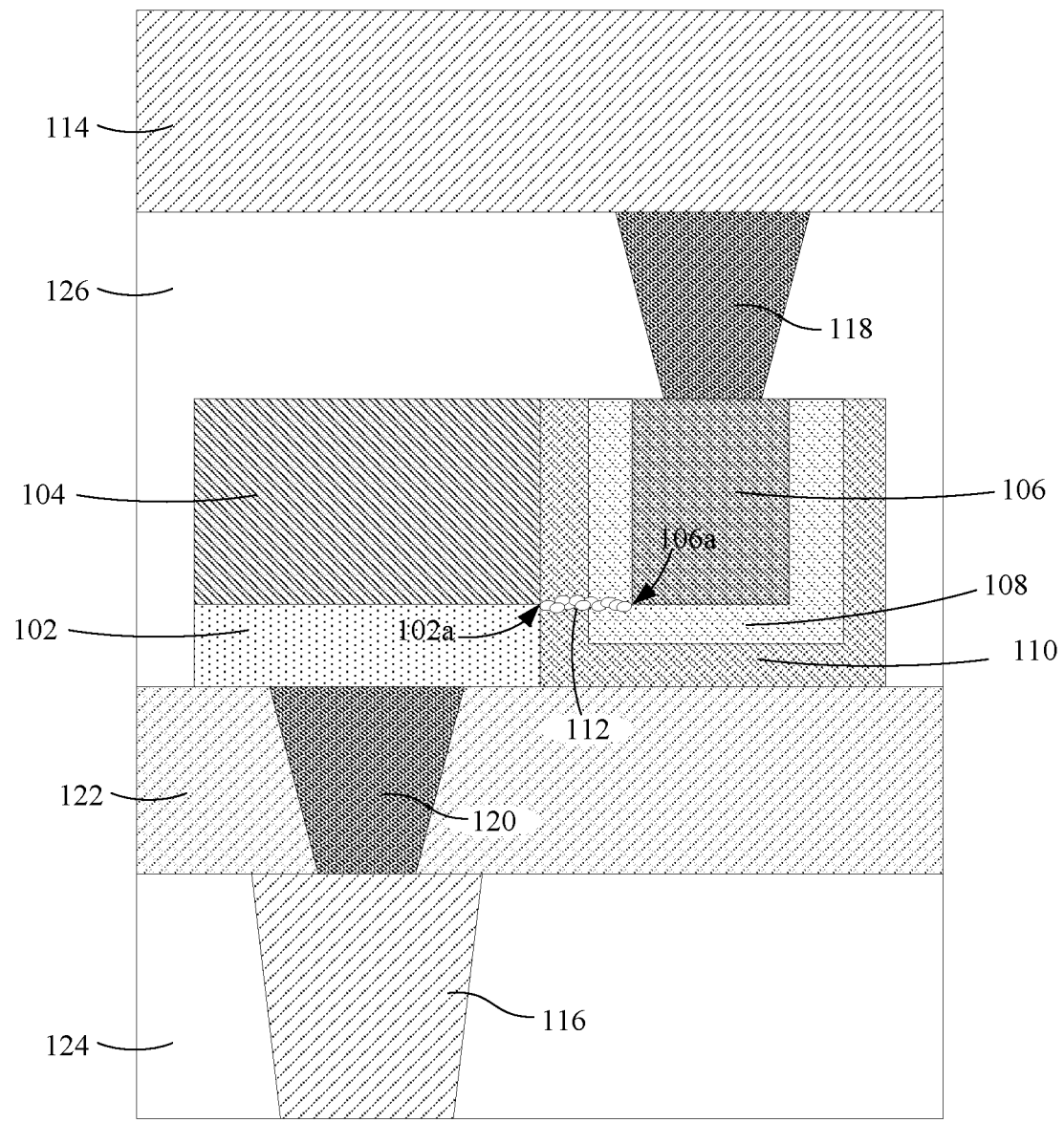

Referring to FIG. 1D, in which like reference numerals refer to like features in FIG. 1C, another embodiment of a memory device is shown. The embodiment shown in FIG. 1D is similar to the embodiment shown in FIG. 1C, except that in FIG. 1C, the lower surface of the second electrode 106 is substantially coplanar with the upper surface of the first electrode 102. For example, the respective thicknesses of the resistive layer 108 and the oxygen scavenging layer 110 may be modified so that the corner edge 106a at the lower surface of the second electrode 106 may be proximal to the corner edge 102a at the upper surface of the first electrode 102. The conducting path 112 may be confined in the region between the corner edge 102a of the first electrode 102 and the corner edge 106a of the second electrode 106 when the electric signal is applied, thereby reducing the variability of the resistance of the resistive layer 108.

In another embodiment (not shown), the lower surface of the second electrode 106 may be above the upper surface of the first electrode 102. For example, the respective thicknesses of the resistive layer 108 and the oxygen scavenging layer 110 may be modified such that the lower surface of the second electrode 106 may be raised above the level of the upper surface of the first electrode.

Figure 1E:
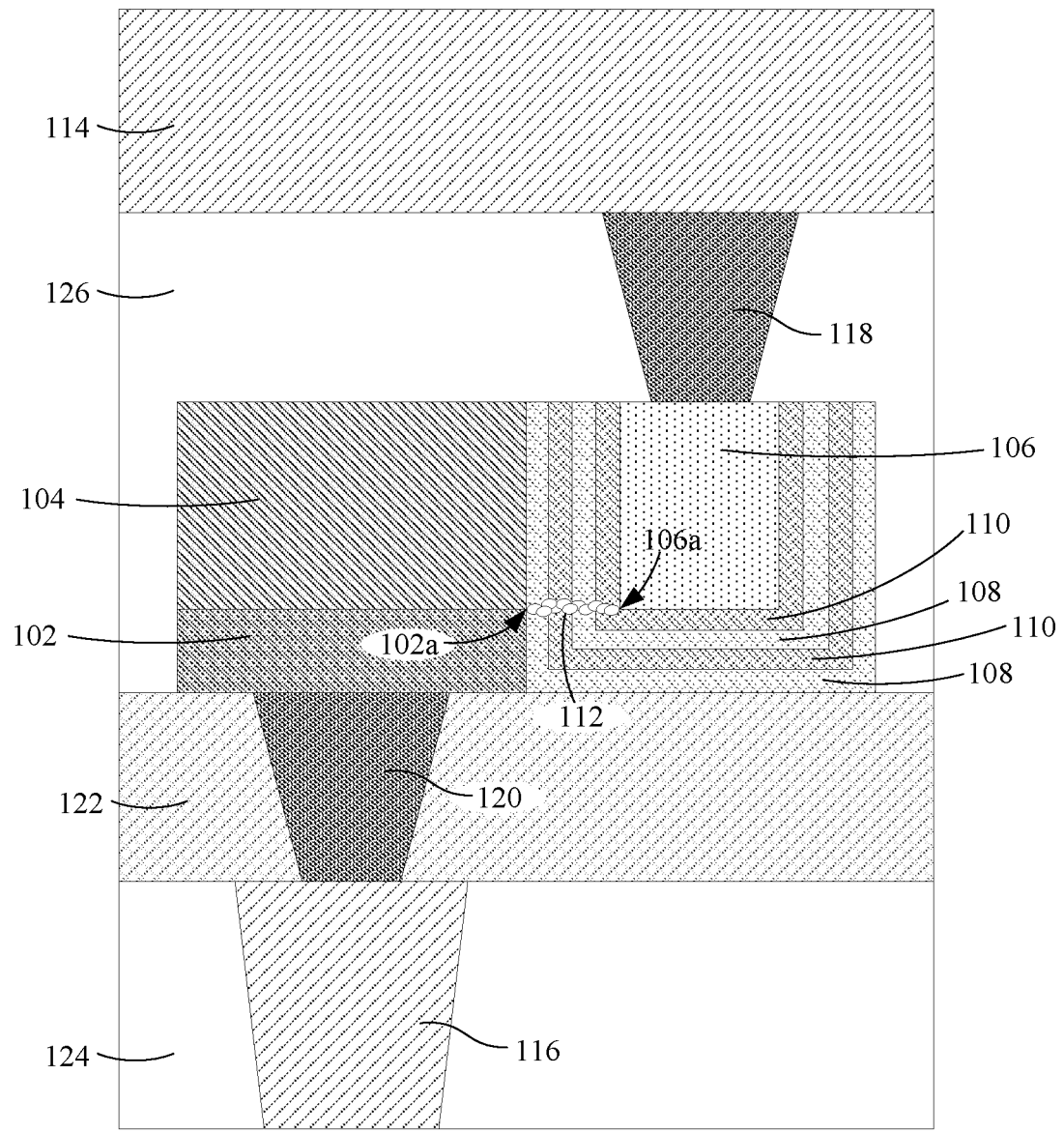

Referring to FIG. 1E, in which like reference numerals refer to like features in FIG. 1D, another embodiment of a memory device is shown. The memory device may include multiple layers of the resistive layer 108 and the oxygen scavenging layer 110 arranged between the first electrode 102 and the second electrode 106. Depending on the thicknesses and the number of layers used, the lower surface of the second electrode 106 may be substantially coplanar with the upper surface of the first electrode 102 such that the corner edge 106a at the lower surface of the second electrode 106 is proximal to the corner edge 102a at the upper surface of the first electrode 102. The conducting path 112 may be confined in the region between the corner edge 102a of the first electrode 102 and the corner edge 106a of the second electrode 106 when the electric signal is applied, thereby reducing the variability of the resistance of the resistive layer 108.

Figure 1F:
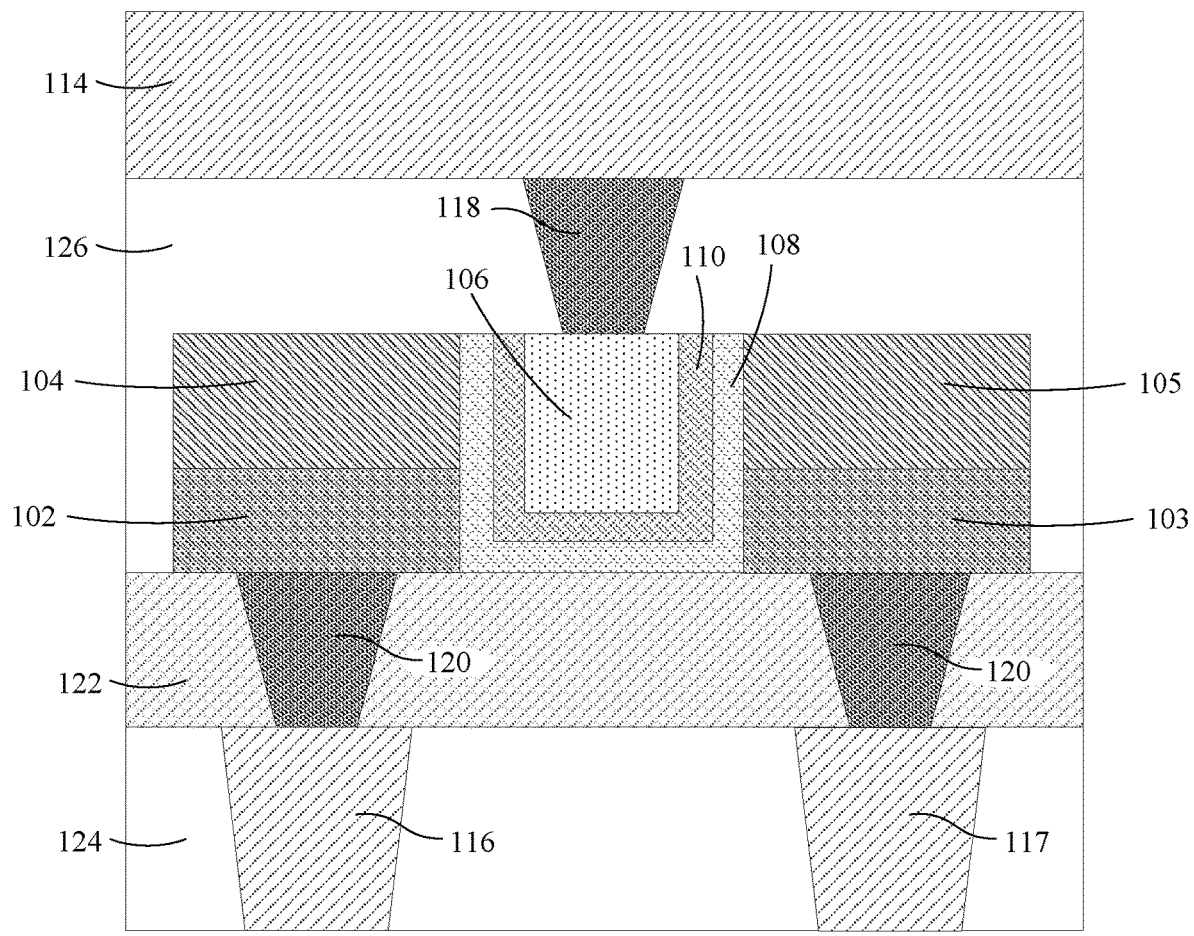

Referring to FIG. 1F, in which like reference numerals refer to like features in FIG. 1B, another embodiment of a memory device is shown. The memory device may include a first electrode 102, a first dielectric cap 104 above the first electrode 102, and a second electrode 106 that is laterally adjacent to the first electrode 102, in which an upper surface of the second electrode 106 is substantially coplanar with an upper surface of the first dielectric cap 104. The memory device may further include a third electrode 103 laterally adjacent to the second electrode 106, in which the second electrode 106 is arranged between the first electrode 102 and the third electrode 103. A second dielectric cap 105 may be disposed above the third electrode 103 and the upper surface of the second electrode 106 may be substantially coplanar with an upper surface of the second dielectric cap 105. The third electrode 103 may include the same conductive material as the first electrode 102 in some embodiments. Alternatively, the first electrode 102 may include a different conductive material from that of the third electrode 103 in other embodiments.

The thickness of the third electrode 103 and the thickness of the first electrode 102 may be substantially similar in some embodiments, or may be dissimilar in other embodiments. The first electrode 102 and the third electrode 103 may have substantially similar widths in some embodiments, or have dissimilar widths in other embodiments. For example, the first electrode 102 and the third electrode 103 may be formed with the same processing steps, which may result in substantially similar thicknesses or widths of both electrodes. In another example, the first electrode 102 and the third electrode 103 may be formed with different processing steps, which may then result in dissimilar thicknesses or widths of both electrodes. The thicknesses, widths, and conductive materials of the first electrode 102 and the third electrode 103 may be modified depending on design requirements of the device.

As described herein, the resistive layer 108 and the oxygen scavenging layer 110 may conform to the sidewalls and the lower surface of the second electrode 106. In particular, the resistive layer 108 and the oxygen scavenging layer 110 may extend to lie between the second electrode 106 and the third electrode 103, as well as between the second electrode 106 and the first electrode 102.

The first electrode 102, the second electrode 106, and the third electrode 103 may be connected to interconnect vias 118, 120 and conductive lines 114, 116, 117. The conductive lines 114, 116, 117 may be configured source lines or word lines, depending on the design requirements of the memory device. For example, in the embodiment shown in FIG. 1F, a bit line (e.g., conductive line 114) may be arranged above and connected to the second electrode 106. A first source line (e.g., conductive line 116) may be arranged below and connected to the first electrode 102, while a second source line (e.g., conductive line 117) may be arranged below and connected to the third electrode 103.

Figure 1G:
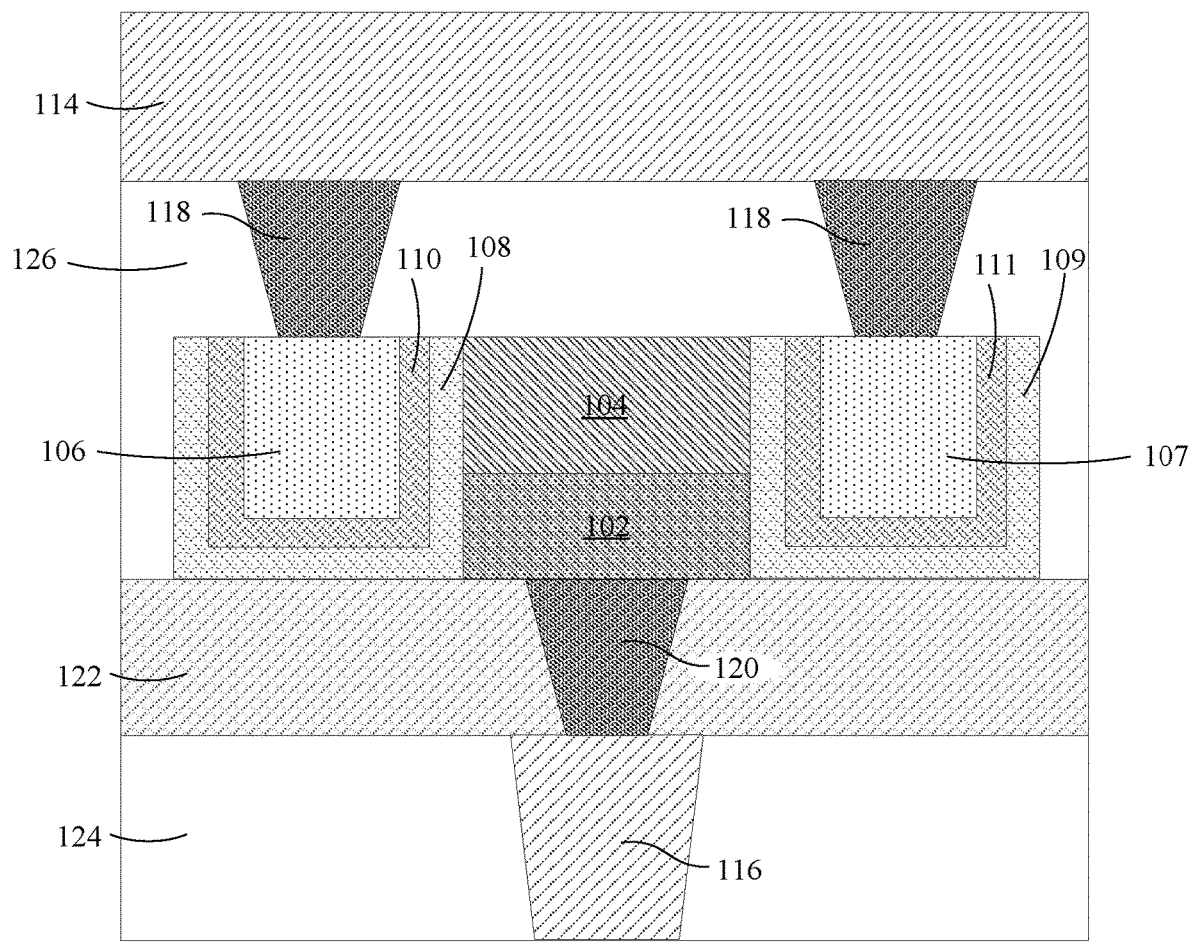

Referring to FIG. 1G, in which like reference numerals refer to like features in FIG. 1B, another embodiment of a memory device is shown. The memory device may include a first electrode 102, a dielectric cap 104 above the first electrode 102, and a second electrode 106 that is laterally adjacent to the first electrode 102. The memory device may further include a third electrode 107 laterally adjacent to the first electrode 102, in which the first electrode 102 may be arranged between the second electrode 106 and the third electrode 107. In the embodiment shown in FIG. 1G, the upper surface of the dielectric cap 104 may be substantially coplanar with an upper surface of the second electrode 106 and an upper surface of the third electrode 107.

The second electrode 106 and the third electrode 107 may have substantially similar thicknesses or widths in some embodiments, or have dissimilar thickness or widths in other embodiments. In some embodiments, the second electrode 106 may include the same conductive material as the third electrode 107. Alternatively, in other embodiments, the second electrode 106 may include a different conductive material as the third electrode 107. The thicknesses, widths, and conductive materials of the second electrode 106 and the third electrode 107 may be modified depending on design requirements of the device.

A first resistive layer 108 and a first oxygen scavenging layer 110 may be arranged between the first electrode 102 and the second electrode 106. The first resistive layer 108 and the first oxygen scavenging layer 110 may conform to sidewalls and a lower surface of the second electrode 106. A second resistive layer 109 and a second oxygen scavenging layer 111 may be arranged between the first electrode 102 and the third electrode 107. The second resistive layer 109 and the second oxygen scavenging layer 111 may conform to sidewalls and a lower surface of the third electrode 107.

The first electrode 102, the second electrode 106, and the third electrode 107 may be connected to interconnect vias 118, 120 and conductive lines 114, 116. The conductive lines 114, 116 may be configured source lines or word lines, depending on the design requirements of the memory device. For example, in the embodiment shown in FIG. 1G, a bit line (e.g., conductive line 114) may be arranged above the second electrode 106 and the third electrode 107. Both of the second electrode and the third electrode 107 may be connected to the bit line. A source line (e.g., conductive line 116) may be arranged below and connected to the first electrode 102.

Figure 2A:
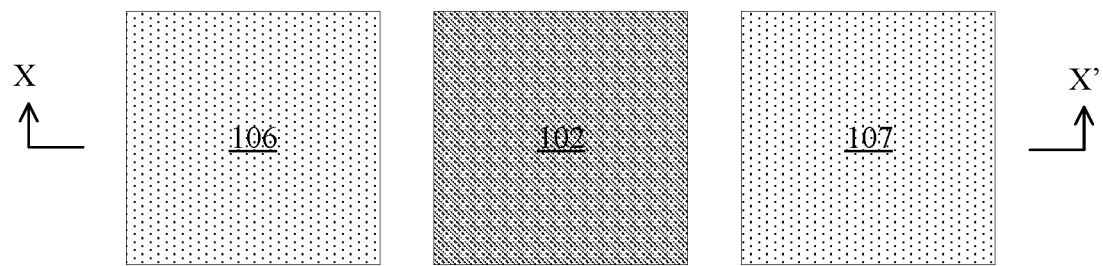
FIG. 2A through FIG. 2C are plan views of the embodiment shown in FIG. 1G and depicts various configurations of the electrodes in the device, in accordance with the present disclosure.
Figure 2B:
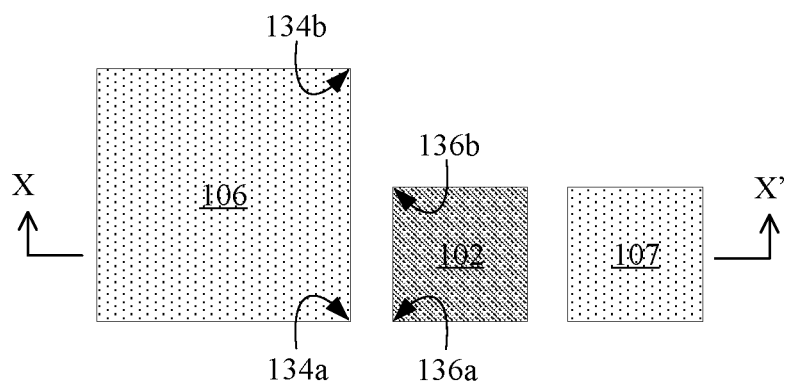
Figure 2C:
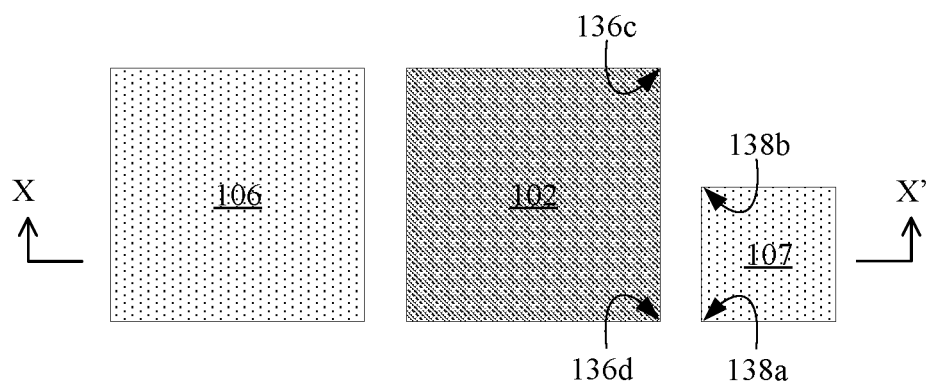

FIG. 2A through FIG. 2C illustrate various configurations of the first electrode 102, the second electrode 106, and the third electrode 107. Section line X-X' indicates the cross-section from which the view in FIG. 1G is taken from. For simplicity, only the first electrode 102, the second electrode 106, and the third electrode 107 are shown. While the electrodes as shown are substantially square shaped, it is understood that other electrode shapes are also within the scope of this disclosure. For example, one or more of the electrodes could have rounded corners or edges that are not perfectly straight due to manufacturing limitations.

FIG. 2A depicts an embodiment in which the first electrode 102, the second electrode 106, and the third electrode 107 have substantially similar widths. As shown in FIG. 2A, side edges of the first electrode 102 may be in substantially equal proximity from side edges of the second electrode 106 and side edges of the third electrode 107.

Alternatively, FIG. 2B and FIG. 2C depict embodiments in which the first electrode 102, the second electrode 106, and the third electrode 107 have dissimilar widths. In the embodiment shown in FIG. 2B, the second electrode 106 may have a larger width than the first electrode 102 and the third electrode 107. Since the first electrode 102 has a smaller width than the second electrode 106, the side edge 136a of the first electrode 102 may be positioned proximal to the side edge 134a of the second electrode 106, while the side edge 136b of the first electrode 102 may be positioned distal to the side edge 134b of the second electrode 106.

In the embodiment shown in FIG. 2C, the third electrode 107 may have a smaller width than the first electrode 102 and the second electrode 106. Since third electrode 107 has a smaller width than the first electrode 102, the side edge 138a of the third electrode 107 may be positioned proximal to the side edge 136d of the first electrode 102, while the side edge 136c of the first electrode 102 may be positioned distal to the side edge 134b of the second electrode 106.

Advantageously, electrodes with dissimilar widths may achieve increased confinement of the filament by ensuring that the conductive path only forms at the shortest distance between the edges of the electrodes (i.e., edges with the closest proximity). An increased confinement of the filament may result in a reduction of variability of the resistance of the resistive layer and a lower voltage level to switch the resistance of the resistive layer.

It should be understood that the configuration of dissimilar electrodes depicted in FIG. 2B and FIG. 2C are contemplated as being applicable to the embodiments of FIG. 1A through FIG. 1F.

The memory device described herein may be a resistive memory device. Examples of the resistive memory device may include, but not limited to, oxide random-access memory (OxRAM).

FIGS. 3 through 8 show a set of steps that may be used to create the memory devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Figure 3:
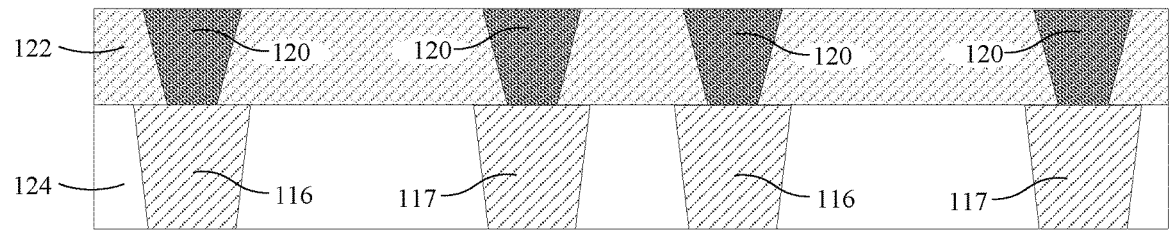
FIG. 3 through FIG. 8 are cross-sectional views depicting an exemplary set of steps for fabricating a memory device, in accordance embodiments with the present disclosure.

Referring to FIG. 3, a device structure for use in fabricating the memory devices of the present disclosure is shown. The device structure may include a first dielectric region 124 having conductive lines 116, 117. A dielectric layer 122 may be deposited upon the first dielectric region 124 using the deposition techniques described herein. Interconnect vias 120 may be formed in the dielectric layer 122, for example, by patterning the dielectric layer 122 to define openings in the dielectric layer 122, followed by deposition of materials in the openings to form the interconnect vias 120.

Figure 4A:
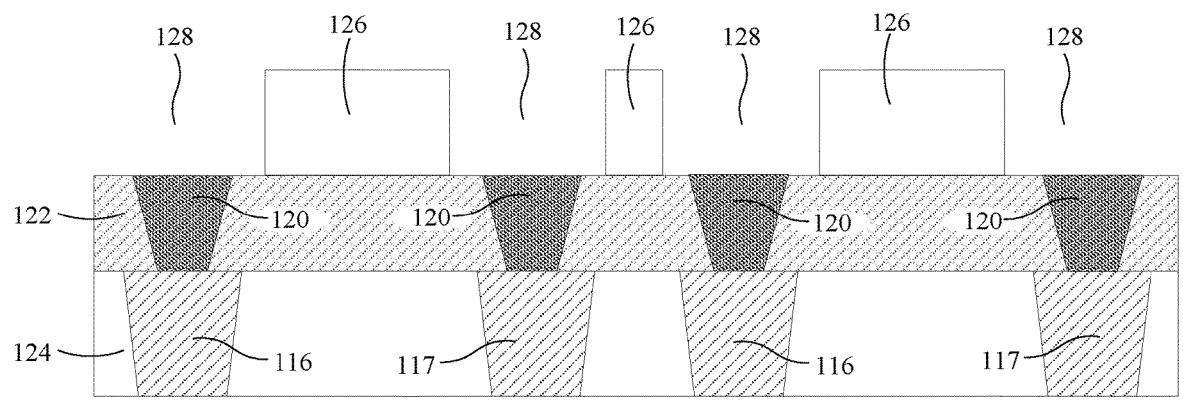
Figure 5:
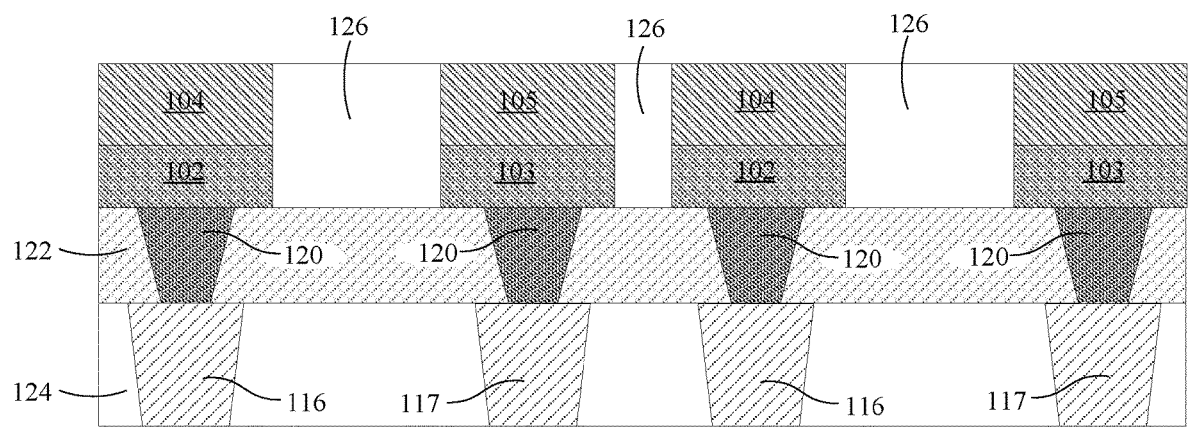

FIG. 4A and FIG. 5 illustrates a set of steps for forming electrodes 102, 103 and dielectric caps 104, 105 in a second dielectric region 126.

As shown in FIG. 4A (FIG. 4A continues from the embodiment shown in FIG. 3), a second dielectric region 126 may be formed upon the dielectric layer 122 by depositing dielectric materials using the deposition techniques described herein. The second dielectric region 126 may be subsequently patterned to define openings 128 in the second dielectric region 126 using the patterning techniques described herein.

As shown in FIG. 5, (FIG. 5 continues from the embodiment shown in FIG. 4A), a first electrode 102 and a third electrode 103 may be formed in the openings 128 by depositing conductive materials using the deposition techniques described herein. Thereafter, a first dielectric cap 104 may be deposited upon the first electrode 102 and a second dielectric cap 105 may be deposited upon the third electrode 103.

Figure 4B:
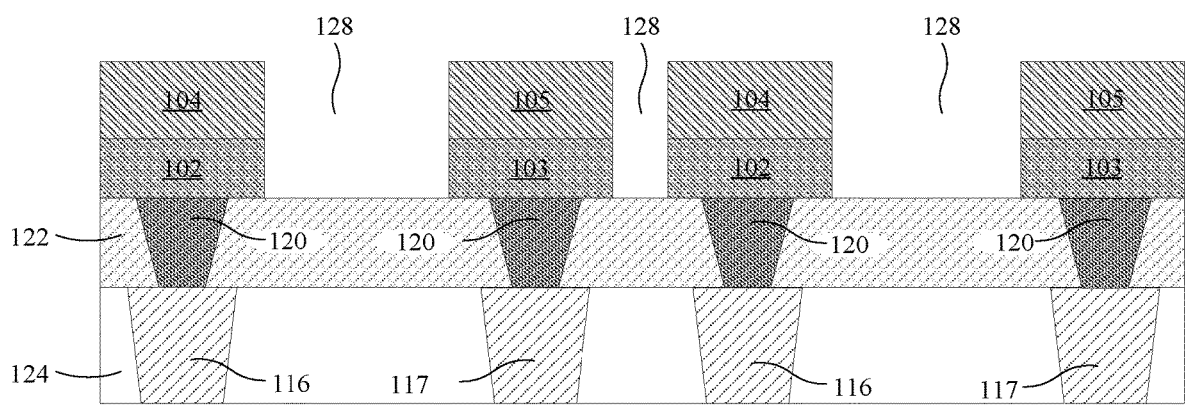

FIG. 4B and FIG. 5 illustrates an alternative set of steps for forming the electrodes 102, 103 and the dielectric caps 104, 105 in the second dielectric region 126.

As shown in FIG. 4B (FIG. 4B continues from the embodiment shown in FIG. 3), a conductive material layer may be deposited upon the dielectric layer 122, and a non-metal material layer may be deposited upon the conductive material layer. A patterning step may be subsequently performed (using the patterning techniques described herein) on the conductive material layer and the non-metal material layer to form the first electrode 102, the third electrode 103, the first dielectric cap 104, and the second dielectric cap 105. The patterning step also defines openings 128 between the first electrode 102 and the third electrode 103. In this embodiment, the first dielectric cap 104 and the second dielectric cap 105 may function as a mask during the patterning step to form the first electrode 102 and the third electrode 103 from the conductive material layer and define the openings 128 between the first electrode 102 and the third electrode 103.

As shown in FIG. 5, (FIG. 5 continues from the embodiment shown in FIG. 4B), a dielectric material may be deposited in the openings 128 between the first electrode and the third electrode 103 using the deposition techniques described herein, thereby forming the second dielectric region 126.

Figure 6:
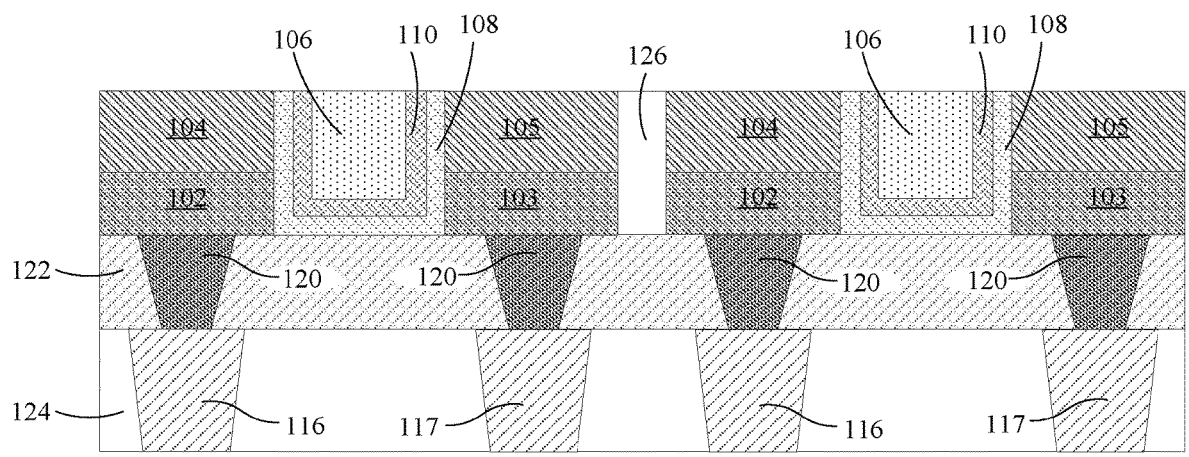

Referring to FIG. 6 (FIG. 6 continues from the embodiment shown in FIG. 5), a second electrode 106 may be formed laterally between the first electrode 102 and the third electrode 103. For example, openings (not shown) may be defined in the second dielectric region 126 using the patterning techniques described herein. A resistive layer 108 may be deposited in the openings using the deposition techniques as described herein. Preferably, a conformal deposition process such as an ALD process or a highly-conformal CVD process may be used to form the resistive layer 108. An oxygen scavenging layer 110 may be deposited on the resistive layer 108 using the deposition techniques described herein. Preferably, the oxygen scavenging layer 110 may be deposited to conform to the resistive layer 108. Subsequently, the second electrode 106 may be deposited on the oxygen scavenging layer 110. A chemical mechanical planarization process may be performed to planarize the upper surface of the second electrode 106 and the upper surfaces of the dielectric caps 104, 105.

In an alternative embodiment (not shown), the oxygen scavenging layer 110 may be deposited in the openings. Thereafter, the resistive layer 108 may be deposited on the oxygen scavenging layer 110, followed by depositing the second electrode 106 on the resistive layer 108.

Figure 7:
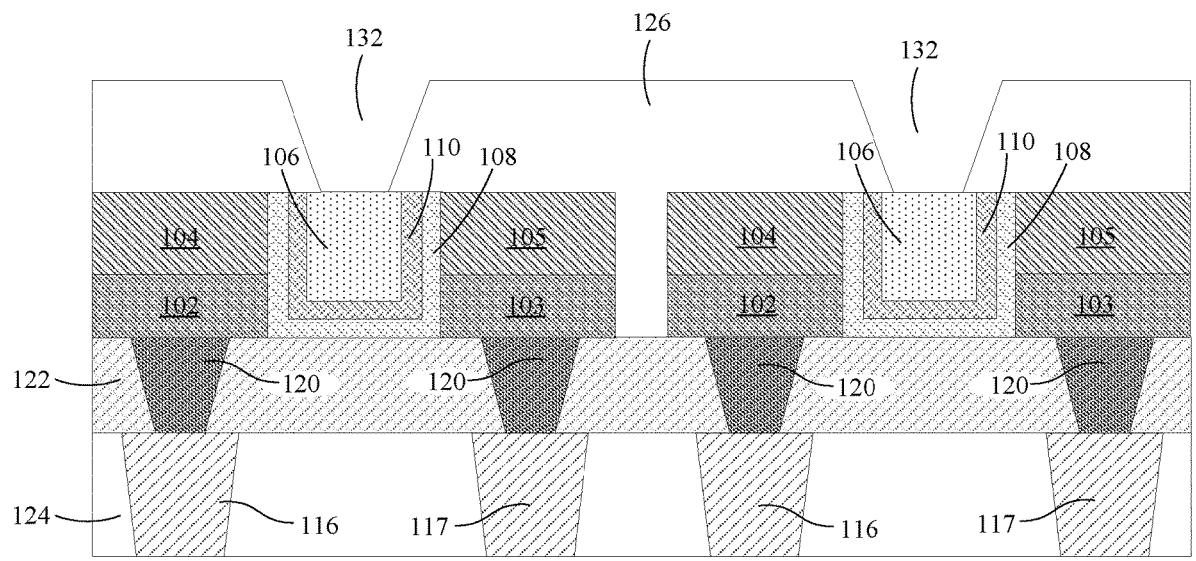

Referring to FIG. 7 (FIG. 7 continues from the embodiment shown in FIG. 6), additional dielectric material may be deposited above the dielectric caps 104, 105 and the second electrode 106. The deposited dielectric material may be patterned to define via openings 132 that expose the upper surface of the second electrode 106.

Figure 8:
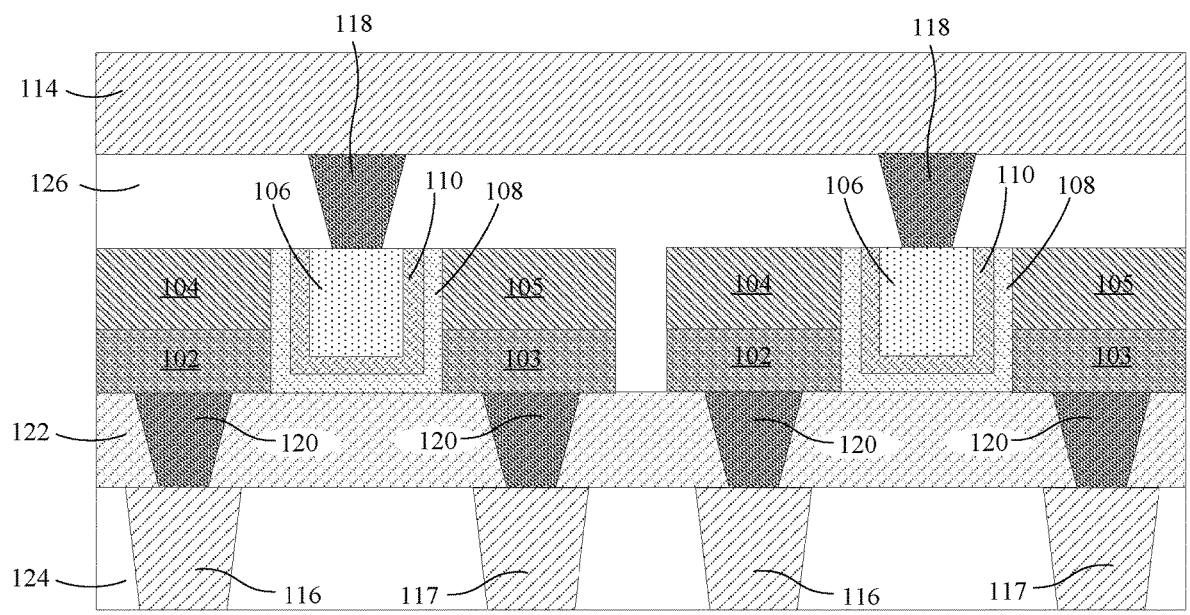

Referring to FIG. 8 (FIG. 8 continues from the embodiment shown in FIG. 7), the via openings 132 may be filled with metal using the deposition techniques described herein to form interconnect vias 118. A conductive line 114 may be formed on the second dielectric region 126 and contacts the interconnect vias 118. In the embodiment shown in FIG. 8, the conductive line 114 may be configured as a bit line while the conductive lines 116, 117 may be configured as source lines.

Figure 9:
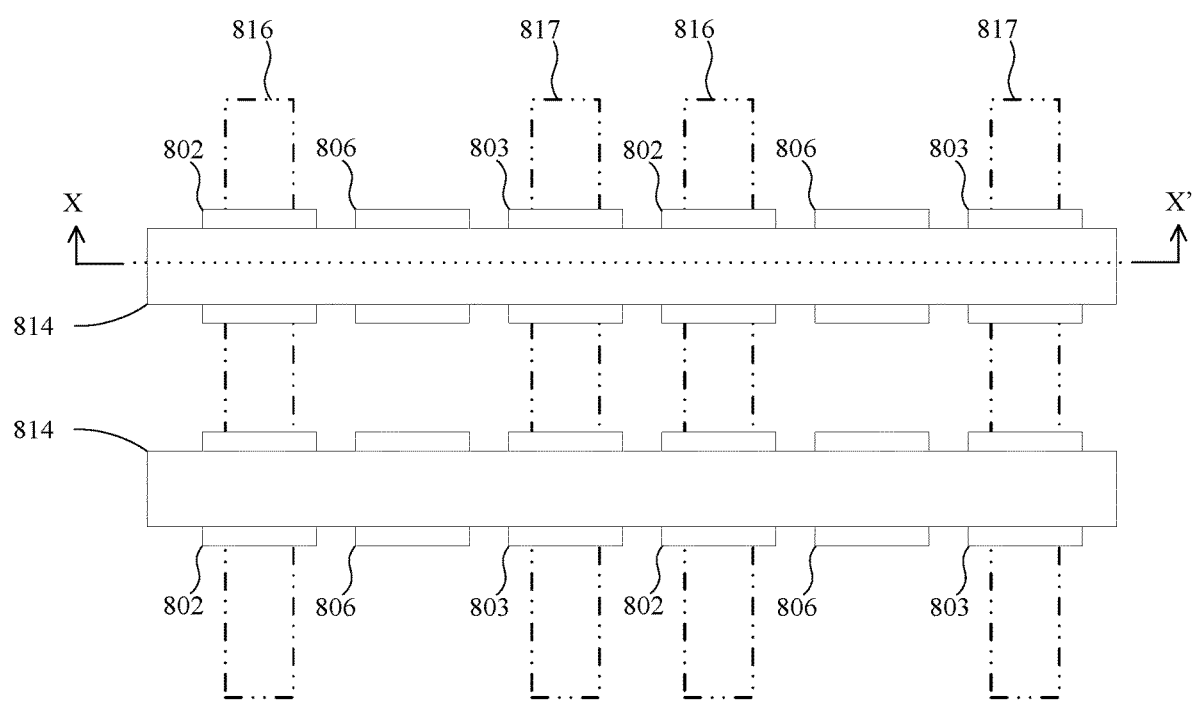
FIG. 9 is a plan view of the embodiment shown in FIG. 7 and depicts a layout of a crossbar configuration of the memory device, in accordance with the present disclosure.

FIG. 9 is a plan view of the embodiment shown in FIG. 8 and illustrates an exemplary crossbar layout configuration of the memory device. Section line X-X' indicates the cross-section from which the view in FIG. 8 is taken from. For simplicity, only the first electrode, the second electrode, the third electrode, the source lines and the bit lines are shown. As shown in FIG. 9, the bit lines 814 are arranged above the first electrodes 802, the second electrodes 806 and the third electrodes 803. The source lines 816, 817 (outlined by broken lined rectangles) are arranged below the first electrodes 802, the second electrodes 806 and the third electrodes 803. The bit lines 814 may straddle across the source lines 816, 817 to provide a crossbar configuration.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
   a first electrode;
   a dielectric cap directly on the first electrode;
   a second electrode laterally adjacent to the first electrode, wherein an upper surface of the second electrode is substantially coplanar with an upper surface of the dielectric cap;
   a resistive layer between the first electrode and the second electrode;
   an oxygen scavenging layer between the first electrode and the second electrode, the oxygen scavenging layer is disposed on the resistive layer and includes a material that is different from the resistive layer, wherein the resistive layer and the oxygen scavenging layer conform to sidewalls and a lower surface of the second electrode, and wherein the lower surface of the second electrode is positioned between an upper surface and a lower surface of the first electrode; and
   a dielectric layer below the first electrode and the oxygen scavenging layer, wherein the oxygen scavenging layer is directly on the dielectric layer.

2. The device of claim 1, wherein the dielectric cap above the first electrode is a first dielectric cap and the device further comprises:
   a third electrode laterally adjacent to the second electrode, wherein the second electrode is arranged between the first electrode and the third electrode; and
   a second dielectric cap above the third electrode, wherein an upper surface of the second dielectric cap is substantially coplanar with the upper surface of the second electrode.

3. The device of claim 2, wherein the resistive layer and the oxygen scavenging layer extends to lie between the third electrode and the second electrode.

4. The device of claim 3, further comprising:
   a bit line arranged above and being connected to the second electrode;
   a first source line arranged below and being connected to the first electrode; and
   a second source line arranged below and being connected to the third electrode, wherein the first source line is substantially parallel to the second source line, and the second electrode is arranged between the first source line and the second source line.

5. The device of claim 4, wherein the bit line straddles across the first source line and the second source line.

6. The device of claim 1, wherein the resistive layer between the first electrode and the second electrode is a first resistive layer, the oxygen scavenging layer between the first electrode and the second electrode is a first oxygen scavenging layer, and the device further comprises:
   a third electrode laterally adjacent to the first electrode, the third electrode has an upper surface, the first electrode is arranged between the second electrode and the third electrode, wherein the upper surface of the dielectric cap is substantially coplanar with the upper surface of the third electrode;
   a second resistive layer between the first electrode and the third electrode; and
   a second oxygen scavenging layer between the first electrode and the third electrode, the second oxygen scavenging layer is disposed on the second resistive layer and includes a material that is different from the second resistive layer, wherein the second resistive layer and the second oxygen scavenging layer conform to sidewalls and a lower surface of the third electrode, and wherein the dielectric layer is below the third electrode and the second oxygen scavenging layer, and the second oxygen scavenging layer is directly on the dielectric layer.

7. The device of claim 6, further comprising:
a bit line arranged above and being connected to the second electrode and the third electrode; and
a source line arranged below and being connected to the first electrode.

8. The device of claim 1, wherein the first electrode is structured as an active electrode, the second electrode is structured as an inert electrode, the active electrode has a larger thickness as compared to the inert electrode, and wherein the oxygen scavenging layer contacts the active electrode.

9. A memory device comprising:
a first electrode;
a dielectric cap above the first electrode;
a second electrode laterally adjacent to the first electrode, wherein an upper surface of the second electrode is substantially coplanar with an upper surface of the dielectric cap; and
a resistive layer between the first electrode and the second electrode, the resistive layer conforms to sidewalls and a lower surface of the second electrode, wherein the lower surface of the second electrode is positioned between an upper surface and a lower surface of the first electrode; and
a dielectric layer below the first electrode and the resistive layer, wherein the resistive layer is directly on the dielectric layer.

10. The device of claim 9, further comprising an oxygen scavenging layer between the first electrode and the second electrode, wherein the oxygen scavenging layer is disposed on the resistive layer and includes a material that is different from the resistive layer.

11. The device of claim 9, wherein the first electrode is structured as an inert electrode, the second electrode is structured as an active electrode, the active electrode has a larger thickness as compared to the inert electrode, and wherein the oxygen scavenging layer contacts the active electrode.

12. The device of claim 10, wherein the resistive layer between the first electrode and the second electrode is a first resistive layer, the oxygen scavenging layer between the first electrode and the second electrode is a first oxygen scavenging layer, and the device further comprises:
a third electrode laterally adjacent to the first electrode, the third electrode has an upper surface, the first electrode is arranged between the second electrode and the third electrode, wherein the upper surface of the dielectric cap is substantially coplanar with the upper surface of the third electrode;
a second resistive layer between the first electrode and the third electrode; and
a second oxygen scavenging layer between the first electrode and the third electrode, the second oxygen scavenging layer is disposed on the second resistive layer and includes a material that is different from the second resistive layer, wherein the dielectric layer is below the third electrode and the second resistive layer, and the second resistive layer is directly on the dielectric layer.

13. The device of claim 12, further comprising:
a bit line arranged above and being connected to the second electrode and the third electrode; and
a source line arranged below and being connected to the first electrode.

14. The device of claim 9, wherein the dielectric cap above the first electrode is a first dielectric cap and the device further comprises:
a third electrode laterally adjacent to the second electrode, wherein the second electrode is arranged between the first electrode and the third electrode;
a second dielectric cap above the third electrode, wherein an upper surface of the second dielectric cap is substantially coplanar with the upper surface of the second electrode.

15. The device of claim 14, further comprising:
a bit line arranged above and being connected to the second electrode;
a first source line arranged below and being connected to the first electrode; and
a second source line arranged below and being connected to the third electrode.

* * * * *